United States Patent [19]

Jones

[11] 4,088,903

[45] May 9, 1978

[54] BISTABLE CIRCUITS

[75] Inventor: Edwin Vaughan Jones, Chelmsford, England

[73] Assignee: The Marconi Company Limited, Chelmsford, England

[21] Appl. No.: 768,576

[22] Filed: Feb. 14, 1977

[30] Foreign Application Priority Data

Feb. 19, 1976 United Kingdom ............... 6529/76

[51] Int. Cl.² .................................. H03K 3/286
[52] U.S. Cl. .................................. 307/291; 328/206
[58] Field of Search ............... 207/289, 291; 328/206; 340/173 FF

[56] References Cited

U.S. PATENT DOCUMENTS 3,042,814  7/1962  Campbell, Jr. ............... 307/291 X Primary Examiner—John Zazworsky
Attorney, Agent, or Firm—Diller, Brown, Ramik & Wight

[57] ABSTRACT

A bistable of the emitter coupled type is provided in which the two halves of the bistable are effectively made independently bistable by providing feedback cross-coupling via an additional pair of emitter coupled transistors. This together with the buffering of the outputs which are taken from the additional transistors reduces the effects of clock breakthrough and the effective capacitance of the output modes and provides for a significant increase in potential working speed.

4 Claims, 2 Drawing Figures

U.S.Patent   May 9, 1978   4,088,903

BISTABLE CIRCUITS

Figure 1:
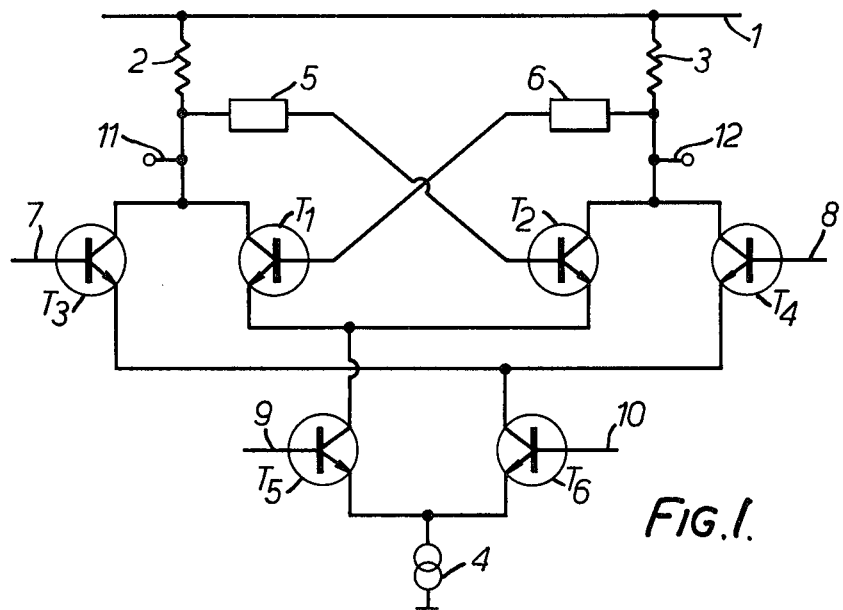

This invention relates to bistable circuits. A known bistable circuit is shown in FIG. 1 of the accompanying drawings. The circuit of FIG. 1 is a non-saturating emitter-coupled bistable and comprises two emitter-coupled transistor pairs $T_1$, $T_2$ and $T_3$, $T_4$ the emitters of the transistors $T_1$ and $T_2$ being connected directly together and similarly the emitters of the transistors $T_3$ and $T_4$.

The collectors of the transistors $T_1$ and $T_3$ are connected directly together at 11 as are the collectors of the transistors $T_2$ and $T_4$ at 12. The coupled collectors of the transistors $T_1$ and $T_3$ and of $T_2$ and $T_4$ are respectively connected to a supply line 1 via load resistors 2 and 3.

The coupled emitters of the transistors $T_1$ and $T_2$ are connected via the collector-emitter path of a transistor $T_5$ to a constant current source 4 and likewise the coupled emitters of the transistors $T_3$ and $T_4$ through a transistor $T_6$, the emitters of the transistors $T_5$ and $T_6$ being connected directly together.

Bistable action is achieved by means of cross connections from the collector sides of resistors 2 and 3 through respective level shifting networks 5 and 6 to the bases of the transistors $T_2$ and $T_1$ respectively.

In operation the bases 7 and 8 of the transistors $T_3$ and $T_4$ respectively act as data inputs to the bistable the bases 7 and 8 receiving signals which are the complement of one another. The bases 9 and 10 of the transistors $T_5$ and $T_6$ provide complementary clock inputs. Complementary outputs Q and $\overline{Q}$ from the bistable are provided at the points 11 and 12.

The normal "steady state" of this bistable occurs when the clock input to the base 9 of the transistor $T_5$ is high. In this condition either the transistor $T_1$ or $T_2$ will be conducting and current will flow through the appropriate transistor of the pair and through the transistor $T_5$. Changes in the data inputs 7 and 8 will have no effect on the bistable under this "steady state" condition.

When the clock signal applied to the base 9 of $T_5$ goes low and that to the base 10 goes high the transistor $T_5$ will turn "off" and current will be routed via one of $T_3$ or $T_4$ through $T_6$.

The states of the data inputs 7 and 8 are thus sampled and the bistable will be set in accordance with the states of these data inputs which may or may not cause a change of state.

When the clock input 9 returns to the high condition the state of the bistable is preserved by transferring current from the $T_3$, $T_4$ pair to the $T_1$, $T_2$ pair.

Such emitter-coupled bistables in discrete component form have the disadvantage of being limited in operation to switching frequencies of the order of 200MHz. One reason for this limitation is clock breakthrough signals at the Q, $\overline{Q}$ outputs 11 and 12 which severely interfere with the data signals to be switched. This breakthrough occurs because the output current flowing through the resistors 2 and 3 and outputs 11 and 12 is re-routed each time the clock signal applied to the input 9 changes state i.e. flows alternately through $T_1$ and $T_3$ for output 11 and $T_4$ and $T_2$ for output 12.

Furthermore, each output node 11, 12 has several components connected to it which has the effect of increasing the capacitance of the nodes and this enhances the clock breakthrough signals. Further clock breakthrough and input data pattern dependent effects will arise due to the differing drive conditions associated with each pair of transistors connected respectively to the output nodes 11, 12.

This invention seeks to provide a bistable circuit in which speed limitations due to the above conditions are at least reduced.

According to this invention there is provided a bistable including first and second pairs of transistors the transistors within a pair having their collectors connected by a current path and arranged to share a current; a third pair of transistors having their emitters connected by a current path; and collectors arranged to share a current; first transistors of the first and second pairs respectively having emitters connected by a current path/ second transistors of the first and second pairs respectively having emitters connected by a current path; means for applying data signals to a first transistor of the first and second pairs; means for applying clock signals to switch current from a second to a first transistor of the first and second pairs in dependence upon the state of the data signals and feedback paths between the collectors of the first pair and the base of a first transistor of the third pair; between the collector of the first transistor of the third pair and the base of the second transistor of the first pair; between the collectors of the second pair and the base of the second transistor of the third pair and between the collector of the second transistor of the third pair and the base of the second transistor of the second pair.

Advantageously data signals are applied in operation to each first transistor of the first and second pairs, the signals applied to one first transistor being the complement of those applied to the other.

Preferably the means for applying clock signals comprises a fourth pair of transistors having emitters connected by a current path to share a current, the collectors of the transistors being respectively connected to the current paths between the emitters of the first and second transistors of the first and second pairs and clock signals are applied in operation to a base of a transistor of the fourth pair.

Conveniently, clock signals are applied in operation to the base of each transistor of the fourth pair, the signals applied to one transistor being the complement of those applied to the other.

This invention will now be described further with reference to FIG. 2 of the accompanying drawings which shows a bistable in accordance with the invention.

Figure 2:
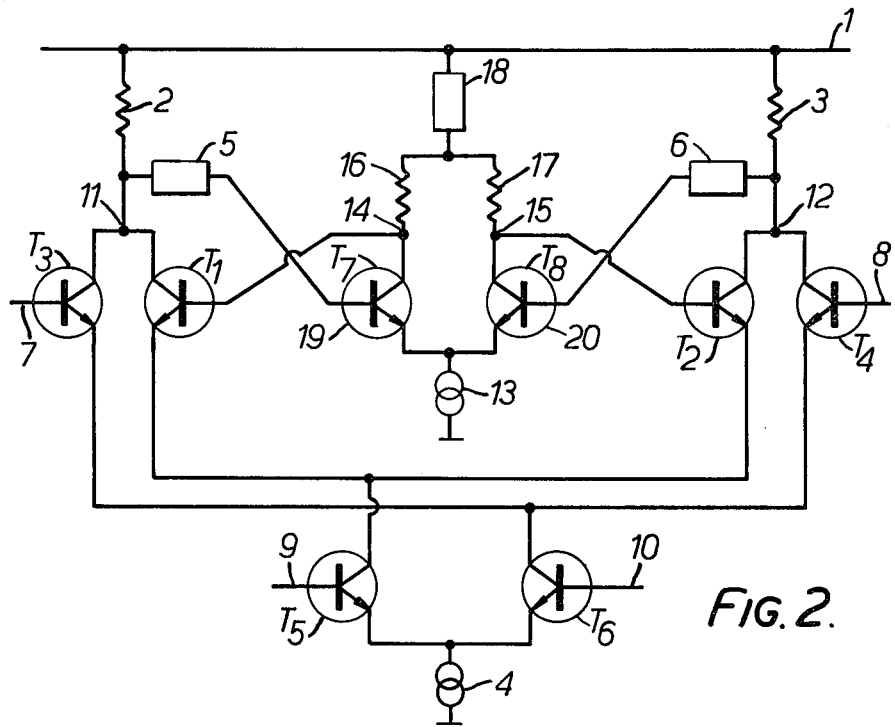

Referring to FIG. 2, where like parts with FIG. 1 bear like reference numerals, the bistable shown differs from that of FIG. 1 by the provision of a third pair of transistors $T_7$ and $T_8$ which have coupled emitters connected to a current source 13, in addition to the first and second pairs formed by $T_1$, $T_3$ and $T_2$, $T_4$ respectively.

The collectors of the transistors $T_7$ and $T_8$ are respectively connected at 14 and 15 to load resistors 16 and 17 the ends of the resistors 16 and 17 remote from 14 and 15 are connected together and via level shifting circuit 18 to the supply line 1.

The transistors $T_7$ and $T_8$ therefore share a current which passes through the source 13 which will result in one of the two transistors being ON whilst the other is OFF. Complementary outputs from the bistable are not now taken from the collectors 11 and 12 but from the load resistors 16 and 17 at 14 and 15 respectively.

The output from the transistor $T_7$ at 14 is fed back to the base of the transistor $T_1$ and the output from $T_1$ at 11 is fed back to the base 19 of the transistor $T_7$. In similar manner the output at 15 from the transistor $T_8$ is fed back to the base of the transistor $T_2$ and the output from $T_2$ at 12 is fed to the base of the base 20 of the transistor $T_8$.

Complementary data signals are again applied to the bases 7 and 8 of the transistors $T_3$ and $T_4$ although data signals could be applied to one or other of the transistors if desired. Complementary inputs are preferred since this acts to increase the speed capability of the circuit.

Similarly complementary clock signals are applied to the bases 9 and 10 of the transistors $T_5$ and $T_6$ although as before a single clock input could be employed.

In the bistable circuit of FIG. 2, the nodes 11 and 12 do not form the outputs from this circuit as would be the case in the circuit of FIG. 1. The outputs from the circuit at the collectors 14 and 15 of the transistors $T_7$ and $T_8$ respectively are therefore buffered by these transistors from clock breakthrough and input pattern dependent effects which are present at the nodes 11 and 12 due to the current re-routing between the transistor pairs $T_1$, $T_2$ and $T_3$, $T_4$.

The additional transistors $T_7$ and $T_8$ do not only provide a buffering of the outputs 14 and 15 from the effects of clock breakthrough but form part of the feedback circuits to the transistors $T_1$ and $T_2$ respectively.

Whilst the transistors $T_1$ and $T_2$ act in complementary manner with one transistor ON whilst the order is OFF under steady state conditions, the switching action can be divided into two halves. One half due to feedback between the transistors $T_1$ and $T_7$ and the other half between the transistors $T_2$ and $T_8$ with the action of the two halves preceding substantially independently without any cross coupling between $T_1$ and $T_2$.

This action of the two halves of the circuit being "independently" bistable helps to ensure that the clock breakthrough and pattern dependent effects are not transmitted between the two halves of the circuit as would be the case in FIG. 1.

Using the circuit of FIG. 2 a discrete component bistable has been constructed having satisfactory switching action at toggle frequencies in the region of 1 to 1.2GHz. The speed advantage gained by this circuit is believed to be derived mainly from the effective buffering of clock breakthrough by the transistors $T_7$ and $T_8$ and by the use of the buffering transistors to provide independent feedback for the two halves of the circuit. In addition the output nodes now at 14 and 15 have fewer connected components and therefore potentially less stray capacitance which reduction is also believed to contribute to a speed improvement.

I claim:

1. A bistable including first and second pairs of transistors the transistors within a pair having their collectors connected by a current path and arranged to share a current; a third pair of transistors having their emitters connected by a current path and collectors arranged to share a current; first transistors of the first and second pairs respectively having emitters connected by a current path; second transistors of the first and second pairs respectively having emitters connected by a current path; means for applying data signals to a first transistor of the first and second pairs; means for applying clock signals to switch current from a second to a first transistor of the first and second pairs in dependence upon the state of the data signals and feedback paths between the collectors of the first pair and the base of a first transistor of the third pair; between the collector of the first transistor of the third pair and the base of the second transistor of the first pair; between the collectors of the second pair and the base of the second transistor of the third pair and between the collector of the second transistor of the third pair and the base of the second transistor of the second pair.

2. A bistable as claimed in claim 1 in which data signals are applied in operation to each first transistor of the first and second pairs, the signals applied to one first transistor being the complement of those applied to the other.

3. A bistable as claimed in claim 1 in which the means for applying clock signals comprises a fourth pair of transistors having emitters connected by a current path to share a current, the collectors of the transistors being respectively connected to the current paths between the emitters of the first and second transistors of the first and second pairs and clock signals are applied in operation to a base of a transistor of the fourth pair.

4. A bistable as claimed in claim 3 in which clock signals are applied in operation to the base of each transistor of the fourth pair the signals applied to one transistor being the complement of those applied to the other.

* * * * *